United States Patent
Akram et al.

(10) Patent No.: US 7,561,938 B2
(45) Date of Patent: **\*Jul. 14, 2009**

(54) METHOD FOR USING DATA REGARDING MANUFACTURING PROCEDURES INTEGRATED CIRCUITS (ICS) HAVE UNDERGONE, SUCH AS REPAIRS, TO SELECT PROCEDURES THE ICS WILL UNDERGO, SUCH AS ADDITIONAL REPAIRS

(75) Inventors: Salman Akram, Boise, ID (US);
Warren M. Farnworth, Nampa, ID (US); Derek J. Gochnour, Boise, ID (US); David R. Hembree, Boise, ID (US); Michael E. Hess, Kuna, ID (US); John O. Jacobson, Boise, ID (US); James M. Wark, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/545,067

(22) Filed: Oct. 6, 2006

(65) Prior Publication Data

US 2007/0088451 A1 Apr. 19, 2007

Related U.S. Application Data

(63) Continuation of application No. 09/653,272, filed on Aug. 31, 2000, now Pat. No. 7,120,513, which is a continuation-in-part of application No. 09/292,655, filed on Apr. 15, 1999, now Pat. No. 6,363,295, which is a continuation of application No. 08/871,015, filed on Jun. 6, 1997, now Pat. No. 5,907,492.

(51) Int. Cl.
*G06F 19/00* (2006.01)

(52) U.S. Cl. .................. 700/121; 700/109; 700/116

(58) Field of Classification Search .............. 700/109, 700/121, 116, 118; 702/117, 118
See application file for complete search history.

(56) References Cited

U.S. PATENT DOCUMENTS

| 4,027,246 A | 5/1977 | Caccoma et al. |
| 4,032,949 A | 6/1977 | Bierig |

(Continued)

FOREIGN PATENT DOCUMENTS

| EP | 0849675 A2 | 6/1998 |

(Continued)

OTHER PUBLICATIONS

Fresonke, Dean, *In-Fab Identification of Silicon Wafers with Clean, Laser Marked Barcodes*, Advanced Semiconductor Manufacturing Conference and Workshop, 1994, IEEE/SEMI, pp. 157-160.

*Primary Examiner*—Albert DeCady
*Assistant Examiner*—Steven R Garland
(74) *Attorney, Agent, or Firm*—Traskbritt (57) ABSTRACT

An inventive method in an integrated circuit (IC) manufacturing process for using data regarding repair procedures conducted on ICs at probe to determine whether any further repairs will be conducted later in the manufacturing process includes storing the data in association with a fuse ID of each of the ICs. The ID codes of the ICs are automatically read, for example, at an opens/shorts test during the manufacturing process. The data stored in association with the ID codes of the ICs is then accessed, and additional repair procedures the ICs may undergo are selected in accordance with the accessed data. Thus, for example, the accessed data may indicate that an IC is unrepairable, so the IC can proceed directly to a scrap bin without having to be queried to determine whether it is repairable, as is necessary in traditional IC manufacturing processes.

24 Claims, 6 Drawing Sheets

U.S. PATENT DOCUMENTS

| | | |
|---|---|---|
| 4,150,331 A | 4/1979 | Lacher |
| 4,454,413 A | 6/1984 | Morton, Jr. |
| 4,455,495 A | 6/1984 | Masuhara et al. |
| 4,460,999 A * | 7/1984 | Schmidt .................... 714/711 |
| 4,510,673 A | 4/1985 | Shils et al. |
| 4,534,014 A | 8/1985 | Ames |
| 4,667,403 A | 5/1987 | Edinger et al. |
| 4,736,373 A | 4/1988 | Schmidt |
| 4,796,194 A | 1/1989 | Atherton |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 4,985,988 A | 1/1991 | Littlebury |
| 5,003,251 A | 3/1991 | Fuoco |
| 5,014,208 A | 5/1991 | Wolfson |
| 5,043,657 A | 8/1991 | Amazeen et al. |
| 5,103,166 A | 4/1992 | Jeon et al. |
| 5,105,362 A | 4/1992 | Kotani |
| 5,110,754 A | 5/1992 | Lowrey et al. |
| 5,118,369 A | 6/1992 | Shamir |
| 5,175,774 A | 12/1992 | Truax et al. |
| 5,197,650 A | 3/1993 | Monzen et al. |
| 5,217,834 A | 6/1993 | Higaki |
| 5,219,765 A | 6/1993 | Yoshida et al. |
| 5,226,118 A | 7/1993 | Baker et al. |
| 5,235,550 A | 8/1993 | Zagar |
| 5,253,208 A | 10/1993 | Kang |
| 5,256,562 A | 10/1993 | Vu et al. |
| 5,256,578 A | 10/1993 | Corley et al. |
| 5,271,796 A | 12/1993 | Miyashita et al. |
| 5,289,113 A | 2/1994 | Meaney et al. |
| 5,294,812 A | 3/1994 | Hashimoto et al. |
| 5,296,402 A | 3/1994 | Ryou |
| 5,301,143 A | 4/1994 | Ohri et al. |
| 5,326,709 A | 7/1994 | Moon et al. |
| 5,345,110 A | 9/1994 | Renfro et al. |
| 5,347,463 A | 9/1994 | Nakamura et al. |
| 5,350,715 A | 9/1994 | Lee |
| 5,352,945 A | 10/1994 | Casper et al. |
| 5,355,320 A | 10/1994 | Erjavic et al. |
| 5,360,747 A | 11/1994 | Larson et al. |
| 5,399,531 A | 3/1995 | Wu |
| 5,420,796 A | 5/1995 | Weling et al. |
| 5,424,652 A | 6/1995 | Hembree et al. |
| 5,428,311 A | 6/1995 | McClure |
| 5,440,240 A | 8/1995 | Wood et al. |
| 5,440,493 A | 8/1995 | Doida |
| 5,442,561 A | 8/1995 | Yoshizawa et al. |
| 5,448,488 A | 9/1995 | Oshima |
| 5,450,326 A | 9/1995 | Black |
| 5,467,304 A | 11/1995 | Uchida et al. |
| 5,477,493 A | 12/1995 | Danbayashi |
| 5,483,175 A | 1/1996 | Ahmad et al. |
| 5,495,417 A | 2/1996 | Fuduka et al. |
| 5,504,369 A | 4/1996 | Dasse et al. |
| 5,511,005 A | 4/1996 | Abbe et al. |
| 5,516,028 A | 5/1996 | Rasp et al. |
| 5,537,325 A | 7/1996 | Iwakiri et al. |
| 5,538,141 A | 7/1996 | Gross, Jr. et al. |
| 5,539,235 A | 7/1996 | Allee |
| 5,550,838 A | 8/1996 | Okajima |
| 5,563,832 A | 10/1996 | Kagami |
| 5,568,408 A | 10/1996 | Maeda |
| 5,570,293 A | 10/1996 | Tanaka et al. |
| 5,581,510 A | 12/1996 | Furusho et al. |
| 5,590,069 A | 12/1996 | Levin |
| 5,600,171 A | 2/1997 | Makihara et al. |
| 5,603,412 A | 2/1997 | Gross, Jr. et al. |
| 5,606,193 A | 2/1997 | Ueda et al. |
| 5,617,366 A | 4/1997 | Yoo |
| 5,619,469 A | 4/1997 | Joo |
| 5,625,816 A | 4/1997 | Burdick et al. |
| 5,642,307 A | 6/1997 | Jernigan |
| 5,654,204 A | 8/1997 | Anderson |
| 5,726,074 A | 3/1998 | Yabe |
| 5,764,650 A | 6/1998 | Debenham |
| 5,787,012 A | 7/1998 | Levitt |
| 5,787,190 A | 7/1998 | Peng et al. |
| 5,801,067 A | 9/1998 | Shaw et al. |
| 5,801,965 A | 9/1998 | Takagi et al. |
| 5,805,472 A | 9/1998 | Fukasawa |
| 5,822,218 A | 10/1998 | Moosa et al. |
| 5,828,778 A | 10/1998 | Hagi et al. |
| 5,837,558 A | 11/1998 | Zuniga et al. |
| 5,844,803 A | 12/1998 | Beffa |
| 5,856,923 A | 1/1999 | Jones et al. |
| 5,865,319 A | 2/1999 | Okuda et al. |
| 5,867,505 A | 2/1999 | Beffa |
| 5,889,674 A | 3/1999 | Burdick et al. |
| 5,890,807 A | 4/1999 | Ingel et al. |
| 5,895,962 A | 4/1999 | Zheng et al. |
| 5,907,492 A | 5/1999 | Akram et al. |
| 5,915,231 A | 6/1999 | Beffa |
| 5,927,512 A | 7/1999 | Beffa |
| 5,946,497 A | 8/1999 | Lee et al. |
| 5,950,012 A | 9/1999 | Shiell et al. |
| 5,963,881 A | 10/1999 | Kahn et al. |
| 5,976,899 A | 11/1999 | Farnworth et al. |
| 5,991,699 A | 11/1999 | Kulkarni et al. |
| 5,994,915 A | 11/1999 | Farnworth et al. |
| 6,000,830 A | 12/1999 | Asano et al. |
| 6,018,686 A | 1/2000 | Orso et al. |
| 6,049,624 A | 4/2000 | Wilson et al. |
| 6,055,463 A | 4/2000 | Cheong et al. |
| 6,067,507 A | 5/2000 | Beffa |
| 6,072,574 A | 6/2000 | Zeimantz |
| 6,075,216 A | 6/2000 | Nakamura et al. |
| 6,100,486 A | 8/2000 | Beffa |
| 6,122,563 A | 9/2000 | Beffa |
| 6,130,442 A | 10/2000 | Di Zenzo et al. |
| 6,138,256 A | 10/2000 | Debenham |
| 6,147,316 A | 11/2000 | Beffa |
| 6,148,307 A | 11/2000 | Burdick et al. |
| 6,190,972 B1 | 2/2001 | Zheng et al. |
| 6,194,738 B1 | 2/2001 | Debenham et al. |
| 6,208,947 B1 | 3/2001 | Beffa |
| 6,219,810 B1 | 4/2001 | Debenham |
| 6,226,394 B1 | 5/2001 | Wilson et al. |
| 6,259,520 B1 | 7/2001 | Zeimantz |
| 6,265,232 B1 | 7/2001 | Simmons |
| 6,292,009 B1 | 9/2001 | Farnworth et al. |
| 6,307,171 B1 | 10/2001 | Beffa |
| 6,350,959 B1 | 2/2002 | Beffa |
| 6,363,295 B1 | 3/2002 | Akram |
| 6,363,329 B2 | 3/2002 | Beffa |
| 6,365,421 B2 | 4/2002 | Debenham et al. |
| 6,365,860 B1 | 4/2002 | Beffa |
| 6,365,861 B1 | 4/2002 | Beffa |
| 6,373,011 B1 | 4/2002 | Beffa |
| 6,373,566 B2 | 4/2002 | Zeimantz |
| 6,400,840 B2 | 6/2002 | Wilson et al. |
| 6,424,168 B1 | 7/2002 | Farnworth et al. |
| 6,427,092 B1 | 7/2002 | Jones et al. |
| 6,437,271 B1 | 8/2002 | Beffa |
| 6,441,897 B1 | 8/2002 | Zeimantz |
| 6,504,123 B2 | 1/2003 | Beffa |
| 6,529,793 B1 | 3/2003 | Beffa |
| 6,534,785 B1 | 3/2003 | Farnworth et al. |
| 6,553,276 B2 | 4/2003 | Akram et al. |
| 6,588,854 B2 | 7/2003 | Wilson et al. |
| 6,594,611 B2 | 7/2003 | Beffa |
| 6,613,590 B2 | 9/2003 | Simmons |
| 6,636,068 B2 | 10/2003 | Farnworth |

| | | | |
|---|---|---|---|
| 6,654,114 B2 | 11/2003 | Zeimantz | |
| 6,703,573 B2 | 3/2004 | Beffa | |
| 6,788,993 B2 | 9/2004 | Beffa | |
| 6,895,538 B2 | 5/2005 | Benedix et al. | |
| 6,944,567 B2 | 9/2005 | Beffa | |
| 7,107,117 B2 | 9/2006 | Beffa | |
| 7,120,287 B2 | 10/2006 | Wilson et al. | |
| 7,120,513 B1 * | 10/2006 | Akram et al. | 700/121 |
| 7,124,050 B2 | 10/2006 | Beffa | |
| 7,155,300 B2 * | 12/2006 | Akram et al. | 700/121 |

FOREIGN PATENT DOCUMENTS

| | | |
|---|---|---|
| JP | 58050728 A | 3/1983 |
| JP | 58052814 A | 3/1983 |
| JP | 58060529 A | 4/1983 |
| JP | 61120433 A | 6/1986 |
| JP | 02164017 A | 6/1990 |
| JP | 02246312 A | 10/1990 |
| JP | 04080949 A | 3/1992 |
| JP | 04318911 A | 11/1992 |
| JP | 05013529 A | 1/1993 |
| JP | 05074909 | 3/1993 |
| JP | 05121573 A | 5/1993 |
| JP | 05315207 | 11/1993 |
| JP | 06013443 A | 1/1994 |
| JP | 06267809 A | 9/1994 |
| JP | 06349691 A | 12/1994 |
| JP | 07050233 | 2/1995 |
| JP | 07066091 A | 3/1995 |
| JP | 07-335510 | 12/1995 |
| JP | 08162380 A | 6/1996 |
| JP | 10104315 A | 4/1998 |
| JP | 11008327 | 1/1999 |
| SU | 1151333 A | 4/1985 |

* cited by examiner

METHOD FOR USING DATA REGARDING MANUFACTURING PROCEDURES INTEGRATED CIRCUITS (ICS) HAVE UNDERGONE, SUCH AS REPAIRS, TO SELECT PROCEDURES THE ICS WILL UNDERGO, SUCH AS ADDITIONAL REPAIRS

CROSS-REFERENCE TO RELATED APPLICATIONS

This application is a continuation of application Ser. No. 09/653,272, filed Aug. 31, 2000, now U.S. Pat. No. 7,120,513 issued Oct. 10, 2006, which application is a continuation-in-part of application Ser. No. 09/292,655, filed Apr. 15, 1999, now U.S. Pat. No. 6,363,295, issued Mar. 26, 2002, which is a continuation of application Ser. No. 08/871,015, filed Jun. 6, 1997, now U.S. Pat. No. 5,907,492, issued May 25, 1999.

This application is also related to: an application having Ser. No. 08/591,238, filed Jan. 17, 1996, entitled "METHOD AND APPARATUS [sic] FOR STORAGE OF TEST RESULTS WITHIN AN INTEGRATED CIRCUIT," abandoned in favor of a continuation-in-part application filed Feb. 27, 1998, having Ser. No. 09/032,417, and entitled "METHOD AND APPARATUS [sic] FOR STORAGE OF TEST RESULTS WITHIN AN INTEGRATED CIRCUIT," now U.S. Pat. No. 6,194,738, issued Feb. 27, 2001; an application having Ser. No. 08/664,109, filed Jun. 13, 1996, entitled "A STRUCTURE AND A METHOD FOR STORING INFORMATION IN A SEMICONDUCTOR DEVICE," now U.S. Pat. No. 5,895,962, issued Apr. 20, 1999; an application filed Jan. 17, 1997 having Ser. No. 08/785,353 and entitled "METHOD FOR SORTING INTEGRATED CIRCUIT DEVICES," now U.S. Pat. No. 5,927,512, issued Jul. 27, 1999; an application filed Feb. 17, 1997 having Ser. No. 08/801,565 and entitled "METHOD OF SORTING A GROUP OF INTEGRATED CIRCUIT DEVICES FOR THOSE DEVICES REQUIRING SPECIAL TESTING," now U.S. Pat. No. 5,844,803, issued Dec. 1, 1998; an application filed Feb. 26, 1997 having Ser. No. 08/806,442 and entitled "METHOD IN AN INTEGRATED CIRCUIT (IC) MANUFACTURING PROCESS FOR IDENTIFYING AND RE-DIRECTING ICS MIS-PROCESSED DURING THEIR MANUFACTURE," now U.S. Pat. No. 5,915,231, issued Jun. 22, 1999; and an application filed Mar. 24, 1997 having Ser. No. 08/822,731 and entitled "METHOD FOR CONTINUOUS, NON LOT-BASED INTEGRATED CIRCUIT MANUFACTURING," now U.S. Pat. No. 5,856,923, issued Jan. 5, 1999.

BACKGROUND OF THE INVENTION

1. Field of the Invention

The present invention relates in general to integrated circuit semiconductor device (IC) manufacturing. More specifically, it relates to methods in IC manufacturing processes for using data regarding manufacturing procedures ICs have undergone, such as repair procedures, to select procedures the ICs will undergo, such as additional repair procedures.

2. State of the Art

Figure 1:
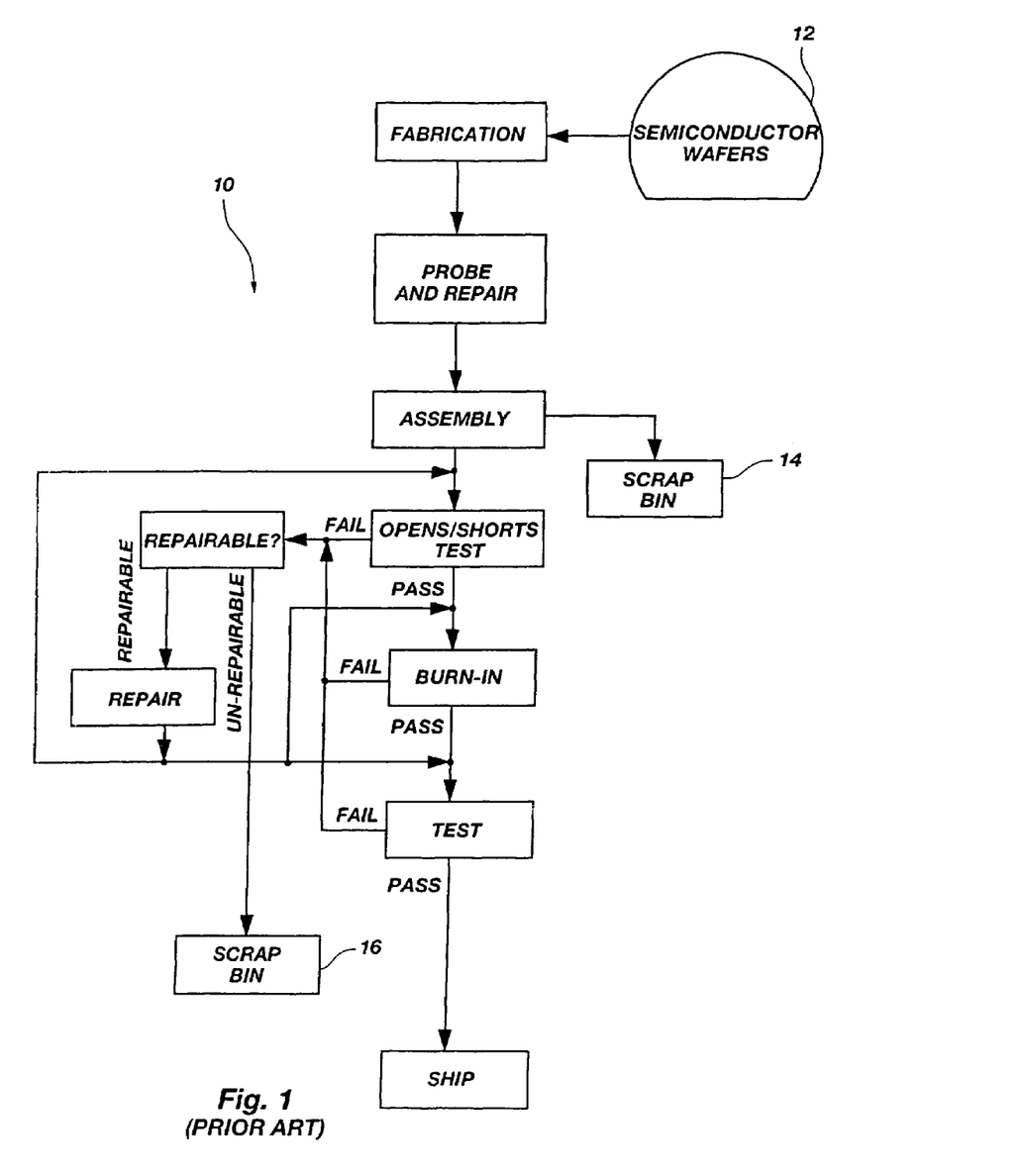
FIG. 1 is a flow diagram illustrating a conventional integrated circuit (IC) device manufacturing process.

As shown in FIG. 1, a typical process 10 for manufacturing very small electronic semiconductor device circuits referred to as "Integrated Circuits" (ICs) begins with the ICs being formed or "fabricated" on the surface of a wafer 12 of semiconductor material, such as silicon. Once fabricated, ICs are electronically probed to determine whether they are functional (i.e., "good") or nonfunctional (i.e., "bad"). If any ICs are found to be bad, an attempt is made to repair those ICs by replacing nonfunctional circuit elements in the ICs with spare circuit elements. For example, Dynamic Random Access Memory (DRAM) ICs are typically repaired by replacing nonfunctional rows or columns of memory cells in the ICs with spare rows or columns.

These repairs are not always successful, because the number of spare circuit elements on an IC may be exhausted before all nonfunctional circuit elements on the IC are replaced, and because some circuit elements on ICs have no spares to replace them. As a result, a number of bad ICs typically remain on a wafer 12 even after attempts are made to repair the ICs. The location of bad ICs on a wafer 12, along with the location of any good ICs on the wafer 12, is typically stored in a computer database commonly referred to as a "wafer map."

After being probed and, if necessary, repaired, ICs begin an assembly process with their wafer 12 being mounted on an adhesive film. In some instances, the film is a special high-adhesion Ultraviolet (UV) film. Without cutting the adhesive film, ICs are sawed from their wafer 12 into discrete IC dice or "chips" using high-speed precision dicing equipment. IC dice mounted on UV film are then exposed to UV light to loosen the grip of the film on the dice. IC dice identified as good by their wafer map are then each "picked" by automated equipment from their sawed wafer 12 and its associated film and "placed" on an epoxy-coated bonding site of one lead frame in a strip of interconnected lead frames, while IC dice identified as bad are discarded into a scrap bin 14. The epoxy attaching the good IC dice to their lead frames is then cured, and the attached dice are wire bonded to their lead frames using high-speed bonding equipment.

Once wire bonded, IC dice and their associated lead frames are formed into IC packages using a hot thermosetting plastic encapsulant injected into a mold. IC packages are then cured to set their plastic encapsulant. After encapsulation and curing, leads of the lead frames projecting from the packages are dipped in a cleansing chemical bath in a process referred to as "de-flash" and then electroplated with a lead/tin finish. Connections between lead frames in lead frame strips are then cut to "singulate" IC packages into discrete IC devices.

After assembly, discrete IC devices are tested in a simple electronic test referred to as an "opens/shorts" test, which checks for "opens" (i.e., no connection) within the devices where connections should exist and "shorts" (i.e., a connection) where connections should not exist. Devices that pass the opens/shorts test proceed on through the process 10 to various burn-in and test procedures where they are tested for functionality, operability, and reliability, and devices that pass these burn-in and test procedures are then typically shipped to customers.

IC devices that fail any of the opens/shorts, burn-in, and test procedures are checked to determine whether they are repairable. This "check" typically includes an electronic "querying" of a device to determine whether enough spare circuit elements remain in the device to effect necessary repairs. Devices determined to be unrepairable are scrapped in a scrap bin 16, while devices that are repairable are repaired, typically by replacing nonfunctional circuit elements in the devices with spare circuit elements in the same manner as described above. After being repaired, these devices then reenter the manufacturing process 10 just prior to the opens/shorts, burn-in, or test procedures they failed.

Electronic querying of IC devices to determine whether spare circuit elements are available to effect repairs increases the time required to move the devices through the manufacturing process 10 and places an additional burden on expensive testing resources. While the extra time added by querying one IC device may be insignificant, the time required to query thousands and thousands of IC devices adds up and can result in a significant reduction in the number of IC devices completing the manufacturing process 10 in a given amount of time. Therefore, there is a need in the art for a method of determining whether enough spare circuit elements are available in an IC device to effect repairs without having to query the device.

Figure 2:
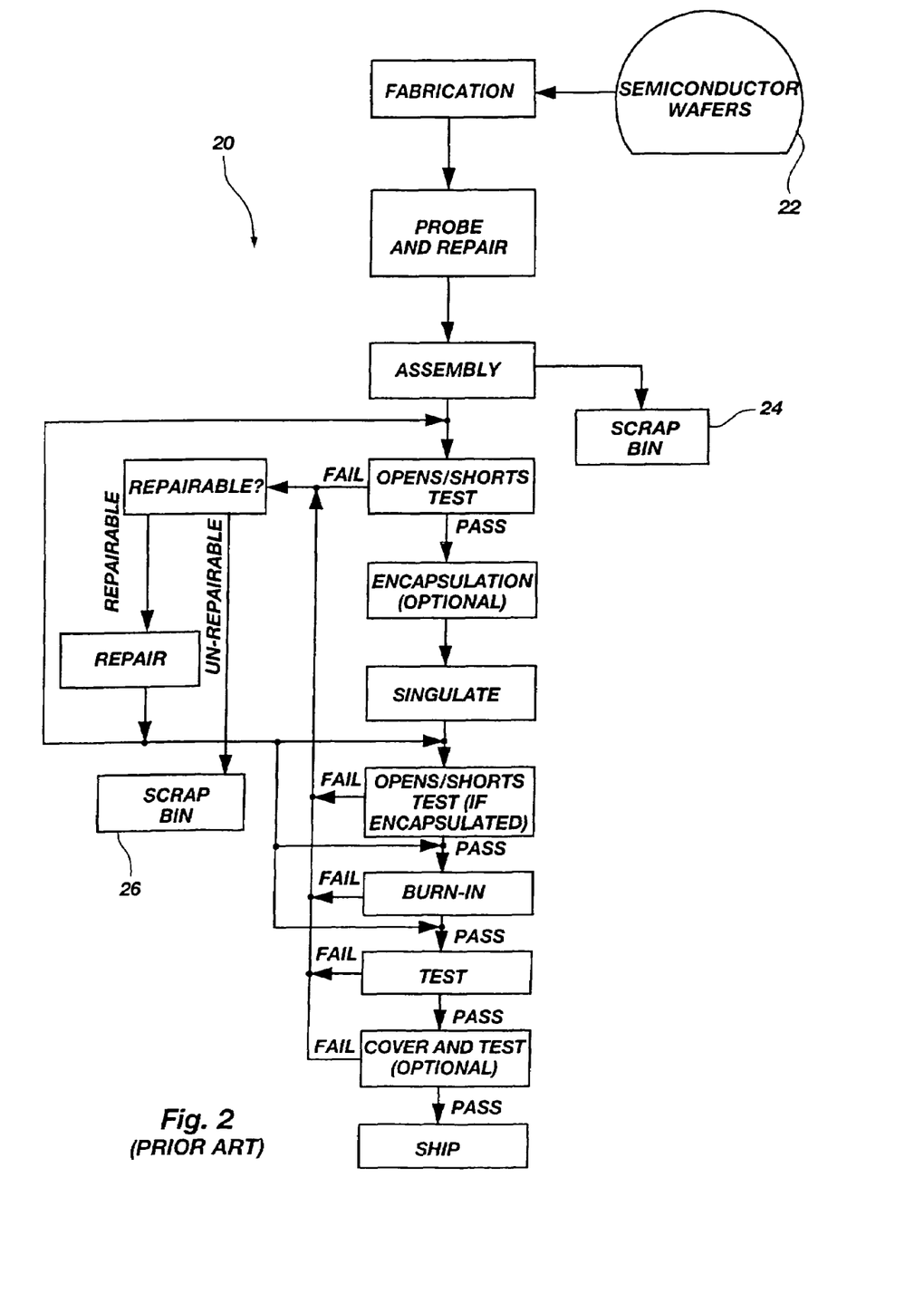
FIG. 2 is a flow diagram illustrating a conventional Chip-On-Board (COB) or flip-chip attached IC manufacturing process.

Similarly, as shown in FIG. 2, a typical process 20 for manufacturing so-called "flip-chip" and "Chip-On-Board" (COB) Multi-Chip Modules (MCMs), in which multiple IC dice are typically attached directly to a substrate, such as a printed circuit board (PCB), begins with ICs being fabricated on a surface of a semiconductor wafer 22 in the same manner as described above. Once fabricated, ICs are electronically probed to determine whether they are good or bad, and if any ICs are found to be bad, an attempt is made to repair those ICs (i.e., make them good ICs) by replacing nonfunctional circuit elements in the ICs with spare circuit elements. The locations of good and bad ICs on a wafer 22 are then typically stored in an electronic wafer map.

After being probed and, if necessary, repaired, ICs begin an assembly process with their wafer 22 being mounted on an adhesive film. Without cutting this film, ICs are then sawed from their wafer 22 into discrete IC dice using high-speed precision dicing equipment. IC dice that are mounted on the special high-adhesion UV film described above are then exposed to UV light to loosen the grip of the film on the dice.

IC dice identified as good by their electronic wafer map are then each picked by automated equipment from their sawed wafer 22 and its associated film, typically for attachment to a substrate in a panel of multiple substrates, such as a panel of interconnected PCBs. If the assembly process is a flip-chip process, picked dice are then flipped and directly attached at their active, front side surfaces to substrates to form MCMs. If the assembly process is a COB process, picked dice are directly attached at their inactive, back side surfaces to adhesive-coated bonding sites of substrates to form MCMs. IC dice identified as bad are discarded into a scrap bin 24.

Panels of MCMs are then cured. If the assembly process is a COB process, the MCMs may be plasma cleaned, if necessary, and the COB IC dice are then wire bonded to their substrates using high-speed bonding equipment.

After assembly, panels of MCMs are tested in an opens/shorts test. Panels having COB IC dice that pass the opens/shorts test proceed on through the manufacturing process 20 so the dice can be encapsulated using an overmold, hard cover, or so-called "glob" top, while panels having flip-chip IC dice that pass the opens/shorts test may have their dice encapsulated using an underfill followed by an overmold, hard cover, or glob top. As will be described in more detail below, alternatively, flip-chip IC dice may be encapsulated after burn-in and test procedures. The disposition of panels of MCMs having COB and flip-chip attached IC dice that fail the opens/shorts test will be described in more detail below.

Panels of MCMs having both COB and flip-chip IC dice, including those panels having flip-chip IC dice that were not encapsulated, are then singulated into discrete MCMs, typically by a shear press or router. After singulation, those MCMs having encapsulated IC dice have their dice tested again in an additional opens/shorts test to check for problems caused by the encapsulation. MCMs having encapsulated dice that pass this additional opens/shorts test, as well as MCMs having dice that were not encapsulated, then proceed on in the manufacturing process 20 to various burn-in and test procedures. The disposition of any MCMs having encapsulated dice that fail the additional opens/shorts test will be described in more detail below.

After the burn-in and test procedures, MCMs having unencapsulated flip-chip IC dice that pass the procedures proceed on in the manufacturing process 20 so their dice may be covered with an overmold, hardcover, or glob top. Dice covered in this manner are then checked in a further opens/shorts test for problems caused by their being covered, and MCMs having dice that pass this further test are then typically shipped to customers. MCMs having encapsulated IC dice that pass the burn-in and test procedures skip this final opens/shorts test and typically proceed to shipping.

MCMs having attached IC dice that fail any of the opens/shorts, burn-in, and test procedures are checked to determine whether their associated IC dice are repairable. This "check" typically includes an electronic querying of the IC dice to determine whether enough spare circuit elements remain in the dice for effecting repairs. MCMs determined to have unrepairable IC dice are then either reworked using replacement IC dice in an expensive and time-consuming procedure or scrapped in a scrap bin 26, while MCMs having IC dice that are repairable are repaired, typically by replacing nonfunctional circuit elements in the IC dice with spare circuit elements. After being repaired, these MCMs then reenter the manufacturing process 20 just prior to the opens/shorts, burn-in, or test procedures they failed.

As discussed above, electronic querying of IC dice to determine whether spare circuit elements are available to effect repairs increases the time required to move MCMs through the manufacturing process 20 and places an additional burden on expensive testing resources. Also, IC dice that require repair, and are found to be unrepairable only after the assembly process, waste assembly time, materials, and resources and necessitate the scrapping or reworking of MCMs that may contain many functional dice. It is desirable, then, to have an IC manufacturing method for identifying unrepairable IC dice so they may be kept out of COB, flip-chip and other MCM assembly processes.

As described in U.S. Pat. Nos. 5,301,143, 5,294,812, and 5,103,166, some methods have been devised to electronically identify IC dice. Such methods take place "off" the manufacturing line, and involve the use of electrically retrievable identification (ID) codes, such as so-called "fuse IDs," programmed into individual IC dice to identify the dice. The programming of a fuse ID typically involves selectively blowing an arrangement of fuses or anti-fuses in an IC die using electric current or a laser so that when the fuses or anti-fuses are accessed, they output a preprogrammed ID code. Unfortunately, none of these methods addresses the problem of identifying unrepairable IC dice "on" a manufacturing line.

SUMMARY OF THE INVENTION

The present invention provides a method in an integrated circuit (IC) manufacturing process for using data regarding manufacturing procedures ICs have undergone, such as repair procedures at probe, to select manufacturing procedures the ICs will undergo, such as additional repair procedures during back-end testing. The ICs are each programmed with a substantially unique identification (ID) code, such as a fuse ID.

The method includes storing data in association with the ID codes of the ICs that identifies manufacturing procedures the ICs have undergone. This data may identify spare circuitry already used to repair the ICs at probe, for example, or spare circuitry available to repair the ICs. The ID codes of the ICs are automatically read, for example, at an opens/shorts test during the manufacturing process. The data stored in association with the ID codes is then accessed, and manufacturing procedures the ICs will undergo, such as additional repair procedures during back-end testing, are selected in accordance with the accessed data. Thus, for example, the accessed data may indicate that insufficient spare circuitry is available on an IC to effect repairs, so the IC can proceed directly to a scrap bin without being "queried" to determine the availability of spare circuitry, as is traditionally necessary. The present invention thus eliminates the time-wasting conventional process of querying ICs prior to repair or scrapping.

Further embodiments include methods of manufacturing IC devices and Multi-Chip Modules (MCMs) which incorporate the method described above.

In an additional embodiment, a method in an MCM manufacturing process for diverting good but unrepairable IC dice from the process includes storing data in association with ID codes, such as fuse IDs, of the ICs that identifies ICs that are a) good and repairable, b) good but unrepairable, and c) bad. In the inventive method, the ID codes of the ICs are automatically read, and the data stored in association with the ID codes is accessed. ICs identified as good but unrepairable by the accessed data are diverted to other IC manufacturing processes, while ICs identified as bad are discarded, and ICs identified as good and repairable are assembled into MCMs.

The present invention thus prevents ICs that are unrepairable from being assembled into MCMs, such as Single In-Line Memory Modules (SIMMs), and thus prevents the reworking or scrapping of MCMs into which unrepairable ICs have been assembled.

DETAILED DESCRIPTION OF THE INVENTION

Figure 3A:
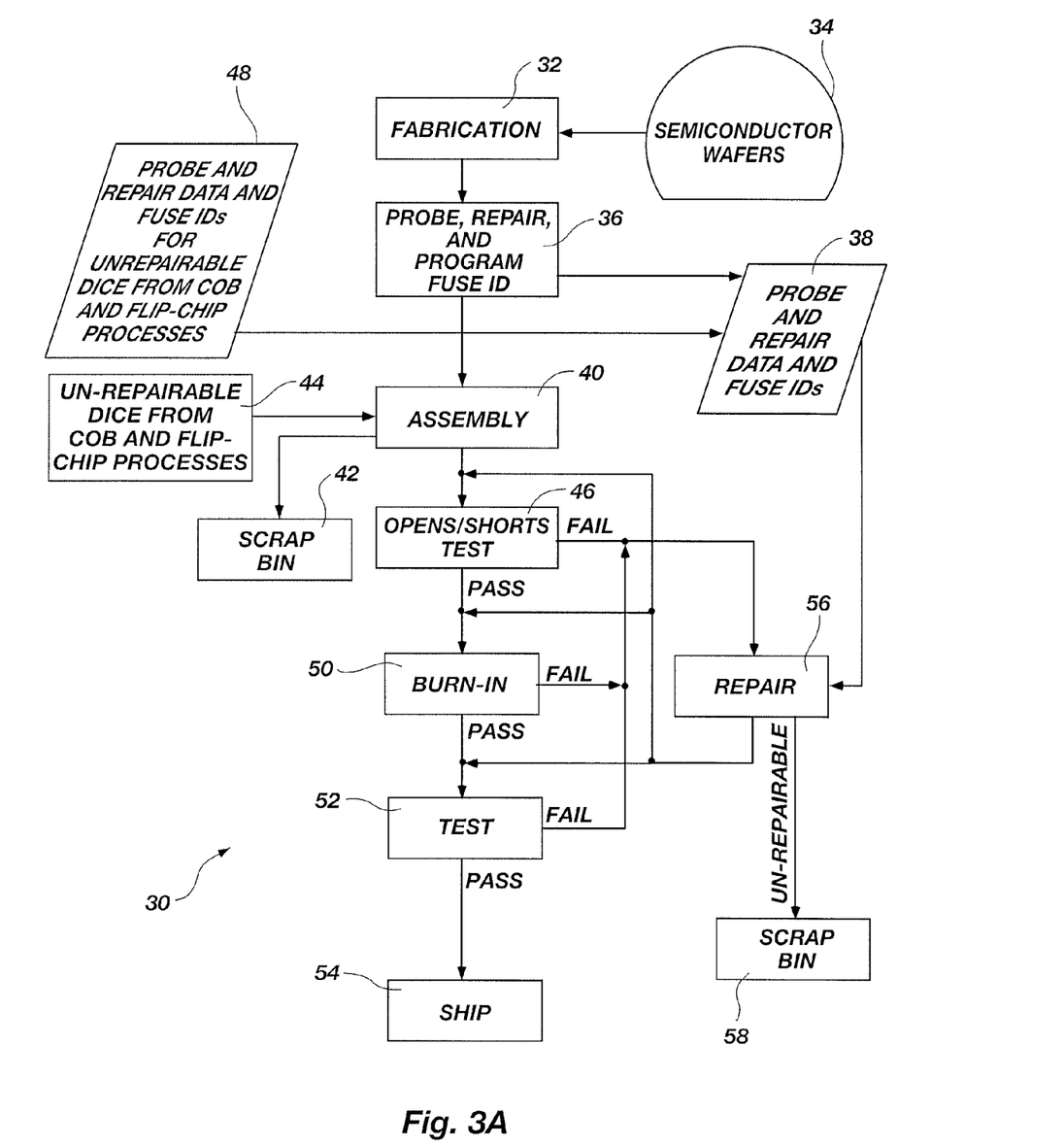
FIG. 3A is a flow diagram illustrating an IC device manufacturing process in accordance with the present invention.

As shown in FIG. 3A, an inventive process 30 for manufacturing Dynamic Random Access Memory (DRAM) Integrated Circuit semiconductor devices (ICs) begins with DRAM ICs being fabricated in a fabrication step 32 on the surface of a semiconductor wafer 34. It will be understood by those having skill in the field of this invention that the present invention is applicable to any IC devices, including Static Random Access Memory (SRAM) ICs, Synchronous DRAM (SDRAM) ICs, processor ICs, Single In-line Memory Modules (SIMMs), Dual In-line Memory Modules (DIMMs), Rambus In-Line Memory Modules (RIMM), Small Outline Rambus In-Line Memory Modules (SO-RIMM), Personal Computer Memory Card International Association (PCMCIA) format, Board-Over-Chip type substrate configurations, and other Multi-Chip Modules (MCMs). It will also be understood that although the present invention will be described below in the context of a wire bond/lead frame assembly process, either a conventional lead frame or leads-over-chip configuration using adhesive tape on the lead frame or the semiconductor die or non-conductive adhesive on an active surface of the semiconductor die (LOC), the present invention is applicable to any IC assembly process, including, for example, Chip-On-Board (COB), either single semiconductor device or the modular form of multiple semiconductor device ICs, Board-Over-Chip (BOC), either single semiconductor device or the modular form of multiple semiconductor device ICs, any configuration of substrate and component including Tessera style electrical components (film on elastomer), flip-chip processes (as will be described below with respect to FIGS. 4A and 4B), Tape-Automated Bonding (TAB) processes, and wafer scale semiconductor device packages or packaging, either the entire wafer as a whole, multiple semiconductor devices as portions of the wafer which are singulated and packaged, or the singulation of the semiconductor devices on the wafer which are later packaged and/or mounted.

Once fabricated, the DRAM ICs are electronically probed in a probe step 36 to determine whether they are good or bad, and if any DRAM ICs are found to be bad, an attempt is made to repair those ICs by replacing nonfunctional rows or columns in the ICs with spare rows or columns. The location of bad DRAM ICs on a wafer 34, along with the location of any good DRAM ICs on the wafer 34, is stored in a computer in an electronic wafer map in association with data identifying spare rows and columns still available in each of the DRAM ICs after any repairs performed at the probe step 36. Of course, it will be understood that the stored data may alternatively identify spare rows and columns used in each of the DRAM ICs to effect repairs at the probe step 36.

During the probe step 36, DRAM ICs fabricated on the wafers 34 are programmed in the manner described above with a fuse identification (ID) unique to each IC. The fuse ID for each DRAM IC is then stored in association with repair data 38 for that IC. The fuse ID may identify, for example, a wafer lot ID, the week the DRAM ICs were fabricated, a wafer ID, a die location on the wafer, and a fabrication facility ID. As a result of storing the fuse ID for each DRAM IC in association with the repair data 38, the availability of spare rows or columns for effecting post-probe repairs in a particular DRAM IC can be determined by using the fuse ID of the IC to access the stored repair data 38 for the IC, as will be described in more detail below.

It will be understood, of course, that the present invention includes within its scope DRAM ICs and other ICs having any ID code, such as a dot code, bar code, or any suitable type marking code on the ICs, including those having fuse IDs. It will also be understood that the ICs may be programmed with their fuse IDs at steps in the manufacturing process 30 other than the probe step 36.

After being probed and, if necessary, repaired, DRAM ICs enter an assembly process 40 in which good ICs are assembled into IC devices, as will be described in more detail below with respect to FIG. 3B, while bad ICs are discarded in a scrap bin 42. In addition, DRAM ICs 44 that have been diverted from COB and flip-chip manufacturing process flows enter the assembly process 40 and are also assembled into IC devices. The DRAM ICs 44 are diverted from the COB and flip-chip process flows because so many of their spare rows and columns have been used at probe to effect repairs in the DRAM ICs 44 that the DRAM ICs 44 fall below a minimum threshold level of repairability, as will be described in more detail below with respect to FIGS. 4A and 4B.

After the assembly process 40, discrete DRAM IC devices are tested in an opens/shorts test 46. There, the fuse ID of the DRAM IC in each IC device is automatically read and correlated with the repair data 38 produced in the manufacturing process 30 or repair data 48 produced in a COB or flip-chip process flow as described below. It should be understood that although the fuse IDs of DRAM ICs in the process 30 are typically read electronically, they may also be read optically if the fuse IDs consist of "blown" laser fuses that are optically accessible. It should also be understood that the fuse IDs of DRAM ICs may be read at steps in the process 30 other than the opens/shorts test 46.

DRAM IC devices that pass the opens/shorts test 46 proceed on through the process 30 to various burn-in and test procedures 50 and 52 where they are tested for functionality, operability, and reliability, and DRAM IC devices that pass these burn-in and test procedures 50 and 52 are shipped 54 to customers.

DRAM IC devices that fail any of the opens/shorts, burn-in, and test procedures 46, 50, and 52 proceed to repair 56. Those DRAM IC devices that do not have enough available spare rows and columns to effect repairs, and thus are unrepairable, are identified as such when their repair data 38 and 48 is accessed at the opens/shorts test 46, and these devices proceed directly to rework or a scrap bin 58 without the need to query them. Of course, DRAM IC devices that are identified by their repair data 38 and 48 as being repairable are repaired, typically by replacing nonfunctional rows and columns with spare rows and columns in the same manner as described above. After being repaired, these DRAM IC devices then reenter the manufacturing process 30 just prior to the opens/shorts, burn-in, or test procedures 46, 50, and 52 they failed.

It should be understood, of course, that the present invention is applicable to situations in a wide variety of IC manufacturing processes in which data regarding manufacturing procedures the ICs have undergone, such as repair procedures at probe, may be accessed through the use of fuse IDs and other ID codes to determine procedures the ICs should undergo, such as post-probe repairs.

Figure 3B:
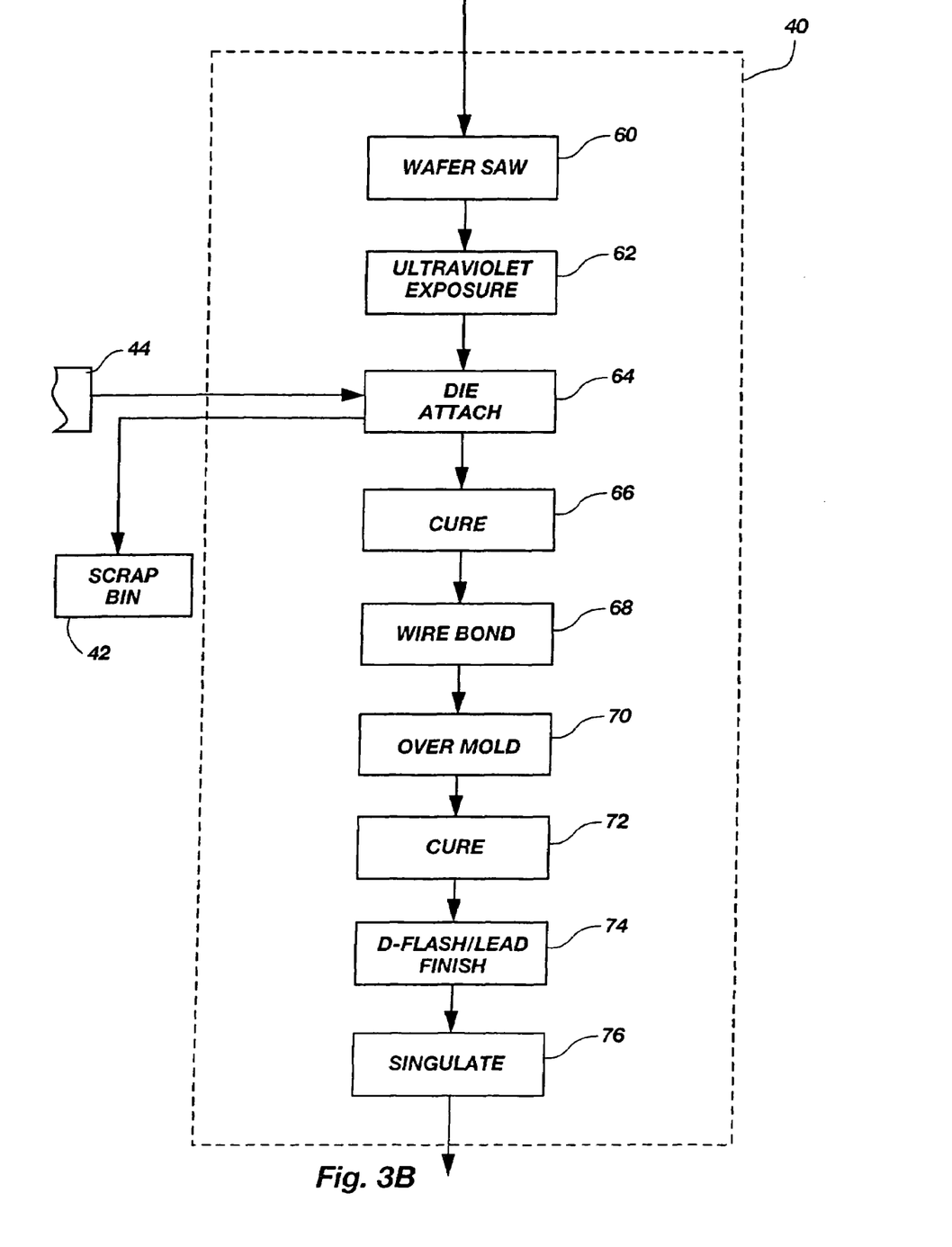
FIG. 3B is a flow diagram illustrating an assembly portion of the manufacturing process of FIG. 3A in more detail.

As stated above, the assembly process 40 of FIG. 3A is shown in more detail in FIG. 3B. In the process 40, probed and repaired semiconductor wafers enter a wafer saw step 60 and are mounted on an adhesive film. The film may be any one of a wide variety of adhesive films used for this purpose, including, for example, a special high-adhesion UV film. Without cutting the film, DRAM ICs are then sawed from their wafer into discrete IC dice using high-speed precision dicing equipment. DRAM IC dice that are mounted on the special high-adhesion UV film are then exposed to UV light in an optional UV exposure step 62 to loosen the grip of the film on the dice.

DRAM IC dice identified as good by their electronic wafer map are then each picked by automated equipment from their sawed wafer and its associated film in a die attach step 64 and placed on an epoxy-coated bonding site of one lead frame in a strip of interconnected lead frames, while DRAM IC dice identified as bad are discarded into the scrap bin 42. In addition, DRAM ICs 44 that have been diverted from COB and flip-chip manufacturing process flows enter the assembly process 40 and are also placed on an adhesive-coated bonding site of one lead frame in a lead frame strip. These diverted DRAM ICs 44 will be described in more detail below with respect to FIGS. 4A and 4B. The adhesive attaching the good DRAM IC dice to their lead frames is then cured, if required, in a cure step 66, and the attached dice are wire bonded to their lead frames using high-speed bonding equipment in a wire bond step 68.

Once wire bonded, DRAM IC dice and their lead frames continue the assembly process 40 by being formed into DRAM IC packages using a hot thermosetting plastic encapsulant injected into a mold in an overmold step 70. DRAM IC packages are then cured in a further cure step 72 to set their plastic encapsulant. After encapsulation and curing, leads of the lead frames projecting from the packages may be dipped in a cleansing chemical bath in a de-flash process 74 and then may be electroplated with a lead/tin finish if they are not already plated. Finally, connections between the lead frames of different DRAM IC packages are then cut in a singulate step 76 to separate the packages into discrete DRAM IC devices.

Figure 4A:
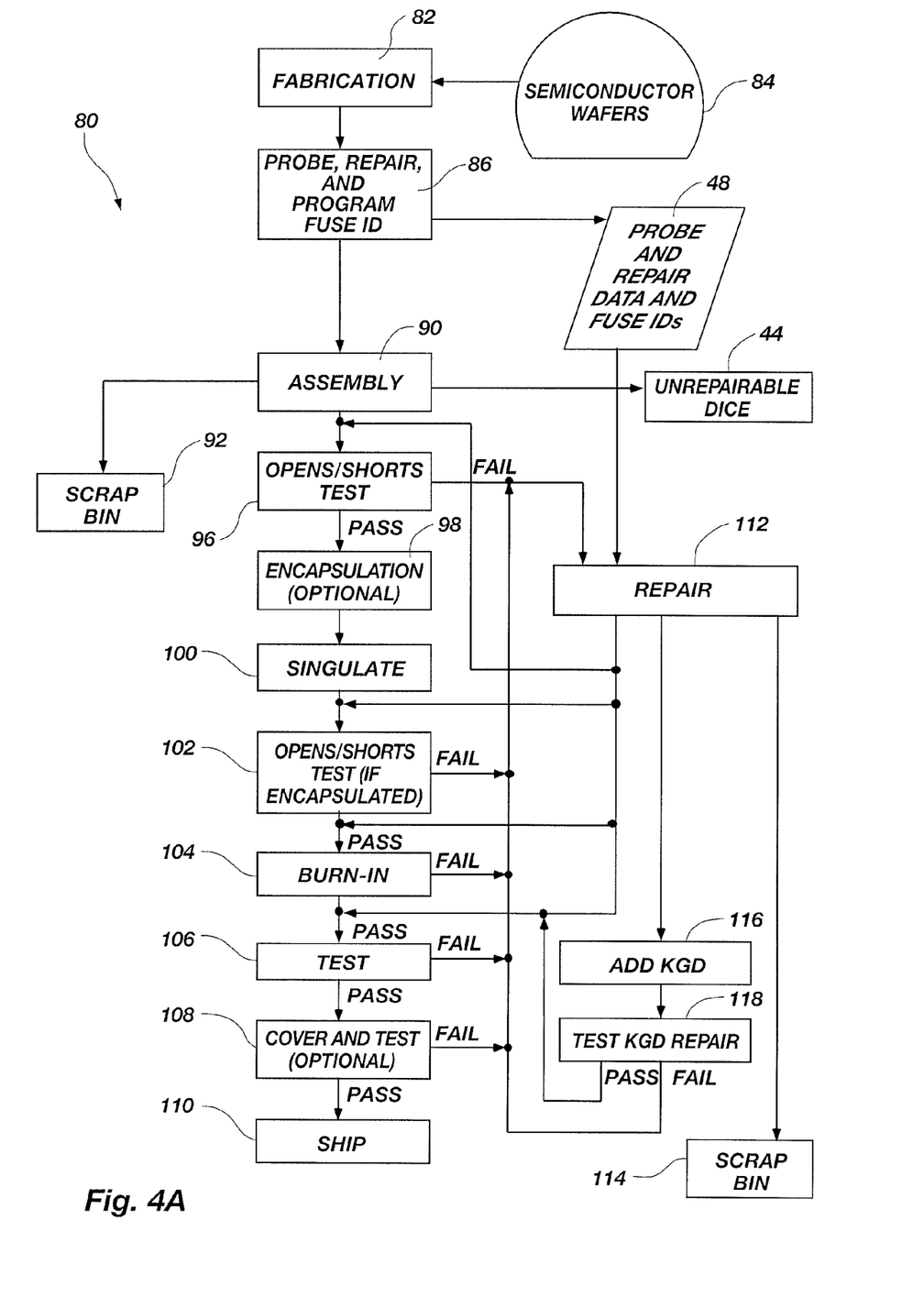
FIG. 4A is a flow diagram illustrating a COB or flip-chip multi-chip module IC manufacturing process in accordance with the present invention.

In another embodiment of the present invention shown in FIG. 4A, an inventive COB or flip-chip process 80 for manufacturing DRAM SIMMs begins with DRAM ICs being fabricated in a fabrication step 82 on a surface of a semiconductor wafer 84. It will be understood by those having skill in the field of this invention that the present invention is applicable to any IC devices, including SRAM ICs, SDRAM ICs, processor ICs, and modules using such IC devices, such as DIMMs, RIMMs, SO-RIMMS, PCMCIAs, COBs, BOCs, and other MCMs. It will also be understood that although the present invention will be described below in the context of both a COB process and a flip-chip assembly process, the present invention is applicable to any IC assembly process, including, for example, Tape-Automated Bonding (TAB) processes, wafer scale processes including packaging, partial wafer scale processes including packaging, etc. It should be further understood that the present invention relates to any type IC that has been singulated by any type singulation process or apparatus, such as wafer saw singulation, laser apparatus singulation, laser/water apparatus singulation (cool laser singulation), water jet apparatus singulation, etc.

Once fabricated, the DRAM ICs are electronically probed in a probe step 86 to determine whether they are good or bad, and if any DRAM ICs are found to be bad, an attempt is made to repair the ICs by replacing nonfunctional rows or columns in the ICs with spare rows or columns. The locations of bad DRAM ICs on a wafer 84, along with the locations of any good DRAM ICs on the wafer 84, are stored in a computer in an electronic wafer map in association with repair data 48 identifying spare rows and columns still available in each of the DRAM ICs after any repairs performed at the probe step 86.

During the probe step 86, DRAM ICs fabricated on the wafers 84 are programmed in the manner described above with a fuse identification (ID) unique to each IC. The fuse ID for each DRAM IC is then stored in association with the repair data 48 for that IC. The fuse ID may identify, for example, a wafer lot ID, the week the DRAM ICs were fabricated, a wafer ID, a die location on the wafer, and a fabrication facility ID.

It will be understood, of course, that the present invention includes within its scope ICs having any ID code, including those having fuse IDs. It will also be understood that the ICs may be programmed with their fuse IDs at steps in the manufacturing process 80 other than the probe step 86.

After being probed and, if necessary, repaired, DRAM ICs enter an assembly process 90 in which good ICs are assembled into panels of physically interconnected DRAM SIMMs, as will be described in more detail below with respect to FIG. 4B, while bad ICs are discarded in a scrap bin 92. In addition, DRAM ICs 44 in which so many spare rows and columns have been used at the probe step 86 to effect repairs that the ICs 44 fall below a minimum threshold of repairability are diverted from the COB or flip-chip process 80 for use in the standard assembly process 40 of FIGS. 3A and 3B. Although a "minimum threshold of repairability" can be set at any level, it might be set, for example, at a level at which statistically the available spare rows and columns in a DRAM IC would only be able to effect repairs in an unacceptably low percentage (e.g., 50%) of cases of failures. Thus, the diverted DRAM ICs 44 typically include those ICs that have exhausted their spare rows and columns in repairs at the probe step 86 and those ICs that have some, but not enough, spare rows and columns left after being repaired at the probe step 86.

The present invention thus prevents DRAM ICs that would be repairable in few or none of the possible cases of failure from being assembled into DRAM SIMMs and other MCMs, and thus prevents the waste of time and resources associated with scrapping or reworking MCMs into which such ICs have traditionally been assembled.

After the assembly process 90, panels of DRAM SIMMs are tested in an opens/shorts test 96. There, the fuse ID of each DRAM IC in each DRAM SIMM is automatically read and correlated with the repair data 48. It should be understood that although the fuse IDs of DRAM ICs in the process 80 are typically read electronically, they may also be read optically if the fuse IDs consist of "blown" laser fuses that are optically accessible. It should also be understood that the fuse IDs of DRAM ICs may be read at steps in the process 80 other than the opens/shorts test 96.

When the manufacturing process 80 is a COB process, panels of DRAM SIMMs having COB IC dice that pass the opens/shorts test 96 proceed to an encapsulation step 98 so the dice can be encapsulated using an overmold, hard cover, or glob top. Alternatively, when the manufacturing process 80 is a flip-chip process, panels of DRAM SIMMs having flip-chip IC dice that pass the opens/shorts test 96 may have their dice encapsulated at the encapsulation step 98 using an underfill followed by an overmold, hard cover, or glob top. As will be described in more detail below, alternatively, the flip-chip IC dice may be encapsulated after burn-in and test procedures. The disposition of panels of DRAM SIMMs having IC dice that fail the opens/shorts test will be described in more detail below.

Panels of DRAM SIMMs having either COB or flip-chip IC dice, including those panels of SIMMs having flip-chip IC dice that were not encapsulated at the encapsulation step 98, are then singulated into discrete DRAM SIMMs at a singulation step 100 by, for example, a water jet or a shear press. This singulation step 100 may, for example, divide a "ten" panel of ten physically attached DRAM SIMMs into ten discrete DRAM SIMMs.

After singulation, DRAM SIMMs having encapsulated IC dice are tested again in an additional opens/shorts test 102 to check for problems caused by the encapsulation step 98. DRAM SIMMs having encapsulated dice that pass this additional opens/shorts test 102, as well as DRAM SIMMs having dice that were not encapsulated, then proceed on in the manufacturing process 80 to burn-in testing 104 and back-end testing 106. The disposition of those DRAM SIMMs having encapsulated IC dice that fail the additional opens/shorts test 102 will be described in more detail below. The fuse IDs of the IC dice in the DRAM SIMMs may also be automatically read at this additional opens/shorts test 102.

After the burn-in and test procedures 104 and 106, DRAM SIMMs having unencapsulated flip-chip IC dice that pass the procedures 104 and 106 proceed on in the process 80 to an optional cover step 108 so their dice may be covered with an overmold, hardcover, or glob top. Dice covered in this manner are then checked in a further opens/shorts test 108 for problems caused by their being covered, and DRAM SIMMs having dice that pass this further test are then typically shipped in a shipping step 110 to customers. DRAM SIMMs having encapsulated IC dice that pass the burn-in and test procedures 104 and 106 skip this covering and final opens/shorts test step 108 and proceed to the shipping step 110. Of course, the fuse IDs of the IC dice in the DRAM SIMMs tested at any of the burn-in, back-end test, and opens/shorts test procedures 104, 106, and 108, respectively, may be automatically read at any one or all of those tests.

DRAM SIMMs having IC dice that fail any of the opens/shorts, burn-in, and test procedures 96, 102, 104, 106 and 108 proceed to repair 112. Those DRAM SIMMs having DRAM IC dice that do not have enough available spare rows and columns to effect repairs, and thus are unrepairable, are identified as such when their repair data 48 is accessed at any one of the opens/shorts, burn-in, and back-end tests 96, 102, 104, 106, and 108, respectively, and these SIMMs proceed directly to rework (described below) or a scrap bin 114 without the need to query them. Of course, DRAM SIMMs having DRAM IC dice identified by their repair data 48 as being repairable are repaired, typically by replacing nonfunctional rows and columns with spare rows and columns in the same manner as described above. After being repaired, these DRAM SIMMs then reenter the manufacturing process 80 just prior to the opens/shorts, burn-in, or test procedures 96, 102, 104, 106 or 108 they failed.

Those DRAM SIMMs that are reworkable by replacing one or more non-functioning IC dice proceed through a Known Good Die (KGD) process in which a DRAM KGD (i.e., a burned-in, fully tested, fully functional DRAM) replaces the non-functioning IC dice on the SIMMs in a replacement step 116. The KGD repairs are then tested in a repair step 118, and if the repairs are successful, the repaired DRAM SIMMs reenter the manufacturing process 80 just prior to the back-end test procedures 106. If the repairs are not successful, the DRAM SIMMs may return to the repair step 112 to be reworked again or, if they are not reworkable, to be scrapped in the scrap bin 114.

Figure 4B:
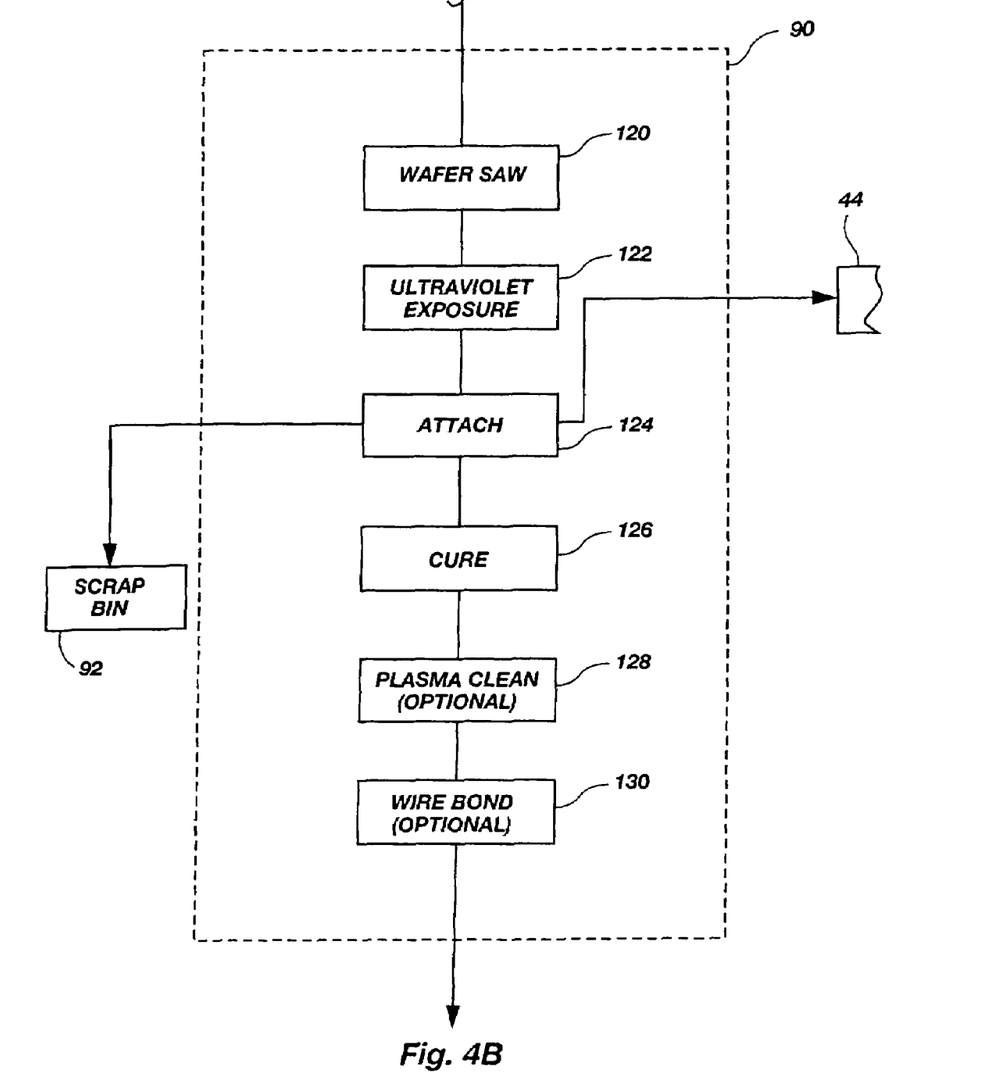
FIG. 4B is a flow diagram illustrating an assembly portion of the manufacturing process of FIG. 4A in more detail.

As stated above, the assembly process 90 of FIG. 4A is shown in more detail in FIG. 4B. In the process 90, probed and repaired semiconductor wafers enter a wafer saw step 120 and are mounted on an adhesive film. The film may be any one of a wide variety of adhesive films used for this purpose, including, for example, a special high-adhesion UV film. Without cutting the film, DRAM ICs are then sawed from their wafer into discrete DRAM IC dice using high-speed precision dicing equipment. DRAM IC dice that are mounted on the special high-adhesion UV film are then exposed to UV light in an optional UV exposure step 122 to loosen the grip of the film on the dice.

IC dice identified as good by their electronic wafer map are then each picked by automated equipment from their sawed wafer and its associated film at an attachment step 124. If the assembly process 90 is a flip-chip process, multiple picked dice are then flipped and directly attached at their active, front side surfaces to a panel of PCBs or other substrates to form, for example, DRAM SIMMs. If the assembly process 90 is a COB process, multiple picked dice are directly attached at their inactive, back side surfaces to an adhesive-coated bonding site of a panel of PCBs or other substrates to form, for example, DRAM SIMMs. DRAM ICs identified as bad are discarded into the scrap bin 92, while DRAM ICs 44 that have used so many of their spare rows and columns in repairs at the probe step 86 that they fall below the minimum threshold of repairability are diverted to the standard assembly process 40 of FIGS. 3A and 3B. Panels of DRAM SIMMs are then cured at a cure step 126. If the assembly process 90 is a COB process, the panels may be plasma cleaned in an optional plasma cleaning step 128, if necessary, and the COB IC dice are then wire bonded at a wire bond step 130 to their DRAM SIMMs using high-speed bonding equipment. DRAM SIMMs then proceed to the opens/shorts test 96 described above with respect to FIG. 4A.

Although the present invention has been described with reference to particular embodiments, the invention is not limited to these embodiments. For example, while the various steps of these embodiments have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. An integrated circuit manufacturing process using data related to manufacturing procedures used previously that a plurality of integrated circuits of Dynamic Random Access Memory (DRAM) semiconductor devices have undergone for selecting manufacturing procedures the plurality of integrated circuits of the Dynamic Random Access Memory (DRAM) semiconductor devices are to undergo, each Dynamic Random Access Memory (DRAM) semiconductor device having integrated circuits and having a substantially unique identification code, the manufacturing process comprising:

storing data in association with the substantially unique identification code of each Dynamic Random Access Memory (DRAM) semiconductor device of the plurality identifying manufacturing procedures each Dynamic Random Access Memory (DRAM) semiconductor device has undergone, the storing data comprising storing data that identifies spare rows and columns used in repairing each DRAM semiconductor device;

automatically reading the substantially unique identification code of each Dynamic Random Access Memory (DRAM) semiconductor device;

accessing the data stored in association with the substantially unique identification code of each Dynamic Random Access Memory (DRAM) semiconductor device; and analyzing the data stored in association with the substantially unique identification code of each Dynamic Random Access Memory (DRAM) semiconductor device for determining the manufacturing procedures used previously for each Dynamic Random Access Memory (DRAM) semiconductor device.

2. The integrated circuit manufacturing process of claim 1, further comprising:

selecting manufacturing procedures each semiconductor device undergoes in accordance with the accessed data.

3. The integrated circuit manufacturing process of claim 2, wherein selecting the manufacturing procedures each semiconductor device undergoes in accordance with the accessed data comprises selecting repairs each semiconductor device undergoes in accordance with the accessed data.

4. The integrated circuit manufacturing process of claim 3, wherein each semiconductor device comprises a Dynamic Random Access Memory (DRAM) semiconductor device, and wherein selecting repairs each semiconductor device undergoes comprises selecting spare rows and columns used to repair each DRAM semiconductor device.

5. The integrated circuit manufacturing process of claim 2, wherein selecting manufacturing procedures each semiconductor device undergoes in accordance with the accessed data comprises selecting whether each semiconductor device undergoes repair procedures.

6. The integrated circuit manufacturing process of claim 5, wherein each semiconductor device comprises a Dynamic Random Access Memory (DRAM) semiconductor device, and wherein selecting whether each semiconductor device undergoes repair procedures comprises selecting whether each DRAM semiconductor device will be repaired in accordance with whether the accessed data indicates enough spare rows and columns are available in each semiconductor device to effect repairs.

7. The integrated circuit manufacturing process of claim 2, wherein selecting manufacturing procedures each semiconductor device will undergo in accordance with the accessed data comprises determining whether each semiconductor device will be assembled into Multi-Chip Modules (MCMs) in accordance with whether the accessed data indicates each semiconductor device is repairable.

8. The integrated circuit manufacturing process of claim 1, wherein storing data comprises storing data that identifies repairs performed on each semiconductor device.

9. The integrated circuit manufacturing process of claim 1, wherein storing data comprises storing data at probe.

10. The integrated circuit manufacturing process of claim 1, wherein automatically reading the substantially unique identification code of each semiconductor device comprises electrically retrieving a unique fuse ID programmed into each semiconductor device.

11. The integrated circuit manufacturing process of claim 1, wherein automatically reading the substantially unique identification code of each semiconductor device comprises optically reading a unique ID code provided on each semiconductor device.

12. The integrated circuit manufacturing process of claim 11, wherein optically reading a unique ID code provided on each semiconductor device comprises optically reading a unique laser fuse ID programmed into each semiconductor device.

13. The integrated circuit manufacturing process of claim 1, wherein automatically reading the substantially unique identification code of each semiconductor device comprises automatically reading the substantially unique identification code of each semiconductor device at one of an opens/shorts test, a burn-in test, and a back-end test in the integrated circuit manufacturing process.

14. The integrated circuit manufacturing process of claim 1, wherein accessing the data stored in association with the substantially unique identification code of each semiconductor device comprises accessing the data stored in association with the substantially unique identification code of each semiconductor device at one of an opens/shorts test, a burn-in test, and a back-end test in the integrated circuit manufacturing process.

15. The integrated circuit manufacturing process of claim 1, further comprising assembling each semiconductor device into a packaged semiconductor device after storing data and before automatically reading the substantially unique identification code of each semiconductor device.

16. A method of manufacturing integrated circuit Dynamic Random Access Memory (DRAM) semiconductor devices from semiconductor wafers, the method comprising:

providing a plurality of semiconductor wafers;
fabricating a plurality of integrated circuit Dynamic Random Access Memory (DRAM) semiconductor devices on each of the semiconductor wafers of the plurality of semiconductor wafers;
causing each integrated circuit Dynamic Random Access Memory (DRAM) semiconductor device of the plurality on each of the semiconductor wafers of the plurality of semiconductor wafers to store a substantially unique identification code;
storing data in association with the substantially unique identification code of each integrated circuit Dynamic Random Access Memory (DRAM) semiconductor device of the plurality that identifies manufacturing procedures each integrated circuit Dynamic Random Access Memory (DRAM) semiconductor device of the plurality has undergone, the storing data comprising storing data that identifies spare rows and columns used in repairing each integrated circuit Dynamic Random Access Memory (DRAM) semiconductor device of the plurality;
separating each integrated circuit Dynamic Random Access Memory (DRAM) semiconductor device of the plurality on each of the semiconductor wafers of the plurality of semiconductor wafers from its wafer to form one integrated circuit Dynamic Random Access Memory (DRAM) semiconductor device of a plurality of integrated circuit Dynamic Random Access Memory (DRAM) semiconductor devices;
assembling each integrated circuit Dynamic Random Access Memory (DRAM) semiconductor device of the plurality into a Dynamic Random Access Memory (DRAM) semiconductor device assembly;
automatically reading the substantially unique identification code associated with each integrated circuit Dynamic Random Access Memory (DRAM) semiconductor device of the plurality;
accessing the data stored in association with the substantially unique identification code associated with each integrated circuit Dynamic Random Access Memory (DRAM) semiconductor device of the plurality; and
reviewing the data stored in association with the substantially unique identification code of each integrated circuit Dynamic Random Access Memory (DRAM) semiconductor device for determining the manufacturing procedures used previously for each integrated circuit Dynamic Random Access Memory (DRAM) semiconductor device.

17. The method of claim 16, further comprising:
selecting manufacturing procedures each semiconductor device undergoes in accordance with the accessed data.

18. The method of claim 16, wherein fabricating a plurality of semiconductor devices on each of the semiconductor wafers of the plurality of semiconductor wafers comprises fabricating semiconductor devices selected from the group comprising Dynamic Random Access Memory (DRAM) semiconductor devices, Static Random Access Memory (SRAM) semiconductor devices, Synchronous DRAM (SDRAM) semiconductor devices, processor semiconductor devices, Rambus in-line memory module type semiconductor devices, small outline Rambus in-line memory module type semiconductor devices, and personal computer memory format type semiconductor devices.

19. The method of claim 16, wherein causing each semiconductor device on each of the semiconductor wafers of the plurality of semiconductor wafers to store a substantially unique identification code comprises programming each semiconductor device on each of the semiconductor wafers of the plurality of semiconductor wafers to permanently store a unique fuse ID.

20. The method of claim 19, wherein programming each semiconductor device on each of the semiconductor wafers of the plurality of semiconductor wafers to permanently store a unique fuse ID comprises programming at least one of fuses and anti-fuses in each semiconductor device on each of the semiconductor wafers of the plurality of semiconductor wafers to permanently store a unique fuse identification.

21. The method of claim 16, wherein assembling each semiconductor device of the plurality of semiconductor devices into a semiconductor device assembly comprises:
picking each semiconductor device of the plurality from its wafer;
placing each semiconductor device of the plurality onto an epoxy-coated bonding site of one lead frame of a plurality of lead frames;
curing the epoxy on the bonding site of each lead frame of the plurality of lead frames;
wire bonding each semiconductor device of the plurality to its associated lead frame;
encapsulating each semiconductor device of the plurality and its associated lead frame to form one of a plurality of semiconductor device assembly packages, each package of the plurality having projecting leads;
curing each of the semiconductor device assembly packages of the plurality;
de-flashing the projecting leads of each semiconductor device assembly package of the plurality;
electroplating the projecting leads of each semiconductor device assembly package of the plurality; and
singulating each semiconductor device assembly package of the plurality into one semiconductor device assembly package of a plurality of discrete semiconductor device assembly packages.

22. The method of claim 16, wherein assembling each semiconductor device of the plurality into a semiconductor device assembly comprises assembling each semiconductor device of the plurality into a semiconductor device assembly selected from the group comprising a wire bond/lead frame semiconductor device, a Chip-On-Board (COB) semiconductor device, a flip-chip semiconductor device, and a Board-Over-Chip (BOC) semiconductor device.

23. A method of manufacturing Multi-Chip Modules (MCMs) from semiconductor wafers, the MCMs selected from the group of Single In-Line Memory Modules (SIMMs) and Dual In-line Memory Modules (DIMMs), Rambus In-Line Memory Modules (RIMMs), Small Outline Rambus In-Line Memory Modules (SO-RIMMs), Personal Computer Memory Card International Association (PCMCIA) format, and Board-Over-Chip type substrates, the method comprising:
providing a plurality of semiconductor wafers;
fabricating a plurality of semiconductor devices on each of the semiconductor wafers of the plurality of semiconductor wafers;
causing each semiconductor device of the plurality of semiconductor devices on each of the semiconductor wafers of the plurality of semiconductor wafers to store a substantially unique identification code;
storing data in association with the substantially unique identification code of each semiconductor device of the plurality of semiconductor devices that identifies manufacturing procedures each semiconductor device of the plurality of semiconductor devices has undergone, the storing data including storing data that identifies rows and columns used in repairing a semiconductor device;

separating each semiconductor device of the plurality of semiconductor devices on each semiconductor wafer of the plurality of semiconductor wafers from its wafer to form one semiconductor device of a plurality of semiconductor devices;

assembling one or more of the semiconductor devices of the plurality into each of a plurality of MCMs;

automatically reading the substantially unique identification code of each semiconductor device of the plurality of semiconductor devices in each MCM of the plurality of MCMs;

accessing the data stored in association with the substantially unique identification code of each semiconductor device of the plurality of semiconductor devices in each MCM of the plurality of MCMs; and reading the data stored in association with the substantially unique identification code of each semiconductor device of the plurality of semiconductor devices for determining the manufacturing procedures used previously for each semiconductor device of the plurality of semiconductor devices.

24. The method of claim 23, further comprising:

selecting manufacturing procedures each semiconductor device of the plurality of semiconductor devices will undergo in accordance with the accessed data.

* * * * *

UNITED STATES PATENT AND TRADEMARK OFFICE
CERTIFICATE OF CORRECTION

PATENT NO.        : 7,561,938 B2                                  Page 1 of 1
APPLICATION NO.   : 11/545067
DATED             : July 14, 2009
INVENTOR(S)       : Salman Akram et al.

It is certified that error appears in the above-identified patent and that said Letters Patent is hereby corrected as shown below:

In column 13, line 62, in Claim 18, after "memory" insert -- card --.

Signed and Sealed this

First Day of September, 2009

David J. Kappos
*Director of the United States Patent and Trademark Office*